United States Patent [19]

Fulton

[11] 4,249,094
[45] Feb. 3, 1981

[54] RELAXATION OSCILLATION LOGIC IN JOSEPHSON JUNCTION CIRCUITS

[75] Inventor: Theodore A. Fulton, Warren Township, Somerset County, N.J.

[73] Assignee: Bell Telephone Laboratories, Incorporated, Murray Hill, N.J.

[21] Appl. No.: 965,327

[22] Filed: Dec. 1, 1978

[51] Int. Cl.$^3$ .................... H03K 19/195; H03K 19/20
[52] U.S. Cl. .................................. 307/277; 307/212; 331/107 S
[58] Field of Search ............... 307/212, 214, 277, 306; 357/5; 331/107 S

[56] References Cited

U.S. PATENT DOCUMENTS

| | | | |
|---|---|---|---|
| 3,564,351 | 2/1971 | McCumber | 307/306 X |
| 3,953,749 | 4/1976 | Baechtold et al. | 307/277 |
| 4,012,642 | 3/1977 | Gueret | 307/212 |
| 4,051,393 | 9/1977 | Fulton | 307/212 X |
| 4,097,765 | 6/1978 | Zappe | 307/212 |

OTHER PUBLICATIONS

F. L. Vernon, Jr. et al., "Relaxation Oscillations in Josephson Junctions", Journal of Applied Physics, vol. 39, No. 6, May 1968, pp. 2661-2664.

H. W. Chan et al., "High-speed switching and logic circuits using Josephson Devices", IEEE Transactions on Magnetics, vol. Mag-11, No. 2, Mar. 1975, pp. 770-773.

H. H. Zappe, "Josephson Quantum Interference Computer Devices", IEEE Transactions on Magnetics, vol. Mag-13, No. 1, Jan. 1977, pp. 41-47.

*Primary Examiner*—John Zazworsky
*Attorney, Agent, or Firm*—Michael J. Urbano

[57] ABSTRACT

A DC powered, self-resetting Josephson junction logic circuit relying on relaxation oscillations is described. A pair of Josephson junction gates are connected in series, a first shunt is connected in parallel with one of the gates, and a second shunt is connected in parallel with the series combination of gates. The resistance of the shunts and the DC bias current bias the gates so that they are capable of undergoing relaxation oscillations. The first shunt forms an output line whereas the second shunt forms a control loop. The bias current is applied to the gates so that, in the quiescent state, the gate in parallel with the second shunt is at $V=O$, and the other gate is undergoing relaxation oscillations. By controlling the state of the first gate with the current in the output loop of another identical circuit, the invert function is performed.

6 Claims, 4 Drawing Figures

RELAXATION OSCILLATION LOGIC IN JOSEPHSON JUNCTION CIRCUITS

BACKGROUND OF THE INVENTION

This invention relates to Josephson junction circuits.

The current-voltage characteristic of a Josephson tunnel junction device is known to have an unstable region at low voltages. If one attempts to voltage bias the device in the unstable region, its operating point jumps back and forth between the supercurrent state ($V=0$) and the finite voltage state ($V\neq 0$, typically $V=2\Delta$, the gap voltage of the superconductor). This process is known as relaxation oscillations. One circuit which induces these oscillations includes a resistor R in parallel with the junction and a bias current source $I_b$ applied to the parallel combination, with the shunt resistance being sufficiently small that the load line falls within the unstable region and with $I_b$ greater than the critical current $I_J$ of the junction. When the junction switches from $V=0$ to $V\neq 0$, the bias current diverts to the resistor, lowering the current in the junction and reducing the junction voltage to the unstable region. Here, the junction voltage returns to $V=0$, and the bias current flows back into the junction until it reaches $I_J$ causing the junction to switch from $V=0$ to $V\neq 0$ again. The oscillation frequency is determined primarily by the resistance R, the inductance L of the shunting path and the ratio $I_b/I_J$. Typical frequencies range from 1 to 50 GHz. Further information on these relaxation oscillations is given by F. L. Vernon et al, *Journal of Applied Physics*, Vol. 39, No. 6, p. 2661 (1968).

While a Josephson junction undergoing relaxation oscillations functions as an oscillator, it can also be viewed as a self-resetting switch, a property in contrast with the latching characteristic of most Josephson junction circuits. A latching junction switches from $V=0$ to $V\neq 0$ when $I_J$ is exceeded and remains in that state until its current is reduced below the "drop-back" or "switch-back" current $I_o$. See U.S. Pat. No. 3,564,351 granted to D. E. McCumber on Feb. 16, 1971. This resetting mode is time consuming and, therefore, decreases the speed of the circuits severely.

Recognizing the disadvantages of latching circuits, several workers in the art have proposed nonlatching or self-resetting schemes capable of being DC powered. P. L. Gueret, in U.S. Pat. No. 4,012,642 issued on Mar. 15, 1977, chooses circuit parameters so that upon removal of an input signal the AC voltage generated across the junction in its $V\neq 0$ state becomes larger than the time-averaged DC voltage across the junction. This condition insures automatic resetting of the junction to its $V=0$ state after removal of the input signals (column 1, lines 49-60). This technique is criticized, however, by W. Baechtold et al in U.S. Pat. No. 3,953,749 issued on Apr. 27, 1976 at column 3, lines 43-50. They state that Gueret's circuit "requires an extremely high current density within the Josephson junction and tight tolerances which are difficult to meet in practice." As an alternative Baechtold et al disclose a self-resetting circuit including a pair of series connected Josephson junctions each being shunted by a load impedance and being connected to a low impedance voltage source. That source delivers a constant voltage corresponding to the gap voltage so that only one of the junctions can exist in the $V\neq 0$ state at a time. By use of relatively long junctions, in which current densities are not too high, (column 7, lines 46-58) the minimum switch-back voltage can be "smaller than even half the energy gap voltage". Long junctions, however, imply commensurately small packing densities.

As mentioned previously, a Josephson junction undergoing relaxation oscillations is essentially a self-resetting switch. H. W. Chan et al [*IEEE Transactions on Magnetics*, Vol. MAG-11, No. 2, p. 770 (1975)] show an elementary logic circuit in which a junction is shunted by a load resistor which is carefully selected to insure resetting. A more complex arrangement, a three-junction interferometer with symmetric split current bias connection, is disclosed by H. H. Zappe [*IEEE Transactions on Magnetics*, Vol. MAG-13, No. 1, p. 41 (1977)]. In both of these designs the circuit is not oscillating when the input is turned off. Thus, they could be used to perform logic OR or AND functions, but a separate circuit would be required to perform inversion (e.g., NOR, NAND and INVERT). Another aspect of these circuits which severely limits their practical utility is that the input or control signals are used to depress $I_J$, and the level to which $I_J$ is decreased determines the amplitude of the oscillating output signal. As a consequence, the current level on the output line is not predictable, and in a chain of logic circuits, the design of downstream logic circuits is rendered extremely difficult, if not impossible.

SUMMARY OF THE INVENTION

In accordance with one aspect of my invention, a DC powered, self-resetting Josephson junction logic circuit relying on relaxation oscillation logic has been designed in which inversion inherently occurs so that NOR, NAND and INVERT, as well as OR and AND, functions can be performed by suitable combinations of the basic circuit, and in which the amplitude of the output signal is predictable and independent of input signal levels. The circuit illustratively comprises first and second series-connected Josephson junction gates $J_A$ and $J_B$ (i.e., single tunnel junctions or combinations of tunnel junctions), a first resistive-inductive shunt ($R_A$, $L_A$) connected in parallel with one of the gates ($J_A$), and a second resistive-inductive shunt ($R_B$, $L_B$) connected in parallel with the series combination of both gates. Resistors $R_A$ and $R_B$ in the shunts bias the gates so that they are capable of undergoing relaxation oscillations for bias currents exceeding their critical currents, i.e., both $J_A$ and $J_B$ are self-resetting. The first shunt and $J_A$ form an output loop whereas the second shunt and $J_A$ and $J_B$ form a control loop. Bias current from a DC source is applied to the series connected gates, and the state of the gate $J_B$ is controlled by a suitable control signal from a third relaxation oscillation gate $J_{A'}$.

Illustratively, the first resistive-inductance shunt forms an output line which can be used to control other downstream circuits. However, for higher speed operation and higher current outputs, it is preferred that the output line be formed instead by the output loop branch which includes $J_A$ and its associated inductance $J_{JA}$. This can be readily achieved by simply designing the circuit topology to make $L_{JA} >> L_A$.

Assuming that the output line is formed by the first shunt including $R_A$ and $L_A$, the circuit operation can be briefly described as follows. The quiescent state of the circuit has $J_B$ not oscillating and fixed at $V=0$ and $J_A$ oscillating between $V=0$ and, say, $V=2\Delta$. Corresponding current pulses appear on the output line to $R_A$. The currents reach some peak value, die away, and then repeat in pulse-like form with characteristic times primarily determined by the resistances and inductances of the loops. Now, when a control pulse from $J_{A'}$ switches $J_B$ to $V=2\Delta$, the current bias that had been flowing into $J_B$ and $J_A$ is diverted to the second shunt including $R_B$, thus depriving $J_A$ of its current bias and causing $J_A$ to stop oscillating. But, the bias current diverted to the second shunt will eventually flow back into $J_B$ and $J_A$ because $J_B$ is also self-resetting. If, however, $J_{A'}$ continues to oscillate, as soon as $J_B$ resets to $V=0$ it receives a control pulse from $J_{A'}$ which switches it again to $V=2\Delta$ before bias current can build up far enough to cause $J_A$ to switch again. The result is that $J_A$ undergoes relaxation oscillations unless $J_{A'}$ is also undergoing relaxation oscillations. In effect, then, the signal seen on the output line is the negative of the signal seen from $J_{A'}$, which constitutes the logic function INVERT.

If in addition to $J_{A'}$ another gate $J_{A''}$ also controls the state of $J_B$, then the circuit would function as a two-input NOR gate from which any of the basic logic operations can be derived.

BRIEF DESCRIPTION OF THE DRAWING

My invention, together with its various features and advantages, can be readily understood from the following more detailed description taken in conjunction with the accompanying drawing, in which.

DETAILED DESCRIPTION

Figure 1:
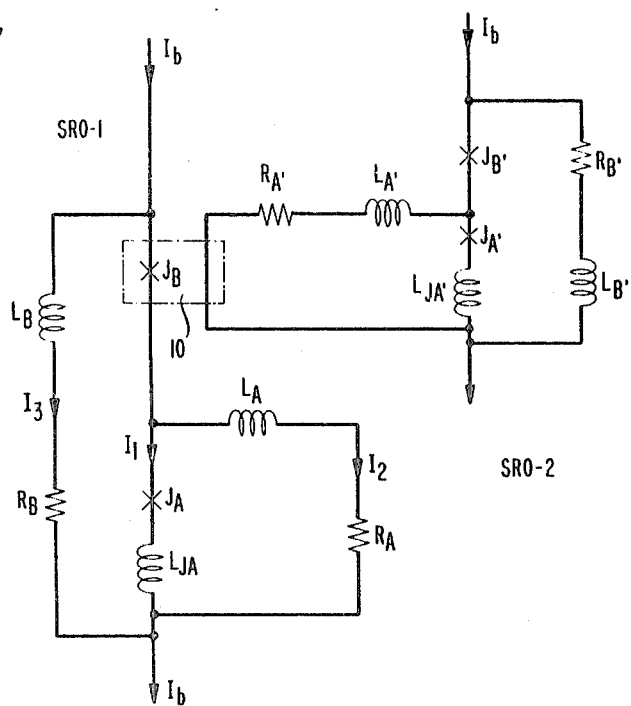
FIG. 1 is a circuit schematic of one embodiment of my invention.

Before discussing my invention in detail, several matters should be understood. First of all, each of the circuits to be described is in practice maintained within a cryogenically cooled environment well known in the art in order to reduce the temperature below the superconducting transition temperature of the superconductors used to form the circuits. Secondly, each of the circuits is in practice typically fabricated on, but insulated from, a superconducting ground plane. The thickness of the insulator between the ground plane and the circuit elements can be used, in conjunction with the thickness and length of the elements, to control the inductances of the circuit branches. Alternatively, the ground plane may be patterned with apertures to control the inductances. Third, in the drawing, discrete inductors are depicted for the purpose of explanation only. These inductors actually represent the distributed self-inductance or mutual inductance of the superconductive conductors or strip lines. All such conductors have some inductance, but inductors are shown only where helpful to the discussion. No lumped-circuit inductors are actually utilized. Fourth, the drawing also depicts discrete resistors which are formed by inserting segments of normal metals of nonsuperconductors in the otherwise superconducting circuit paths.

Figure 2:
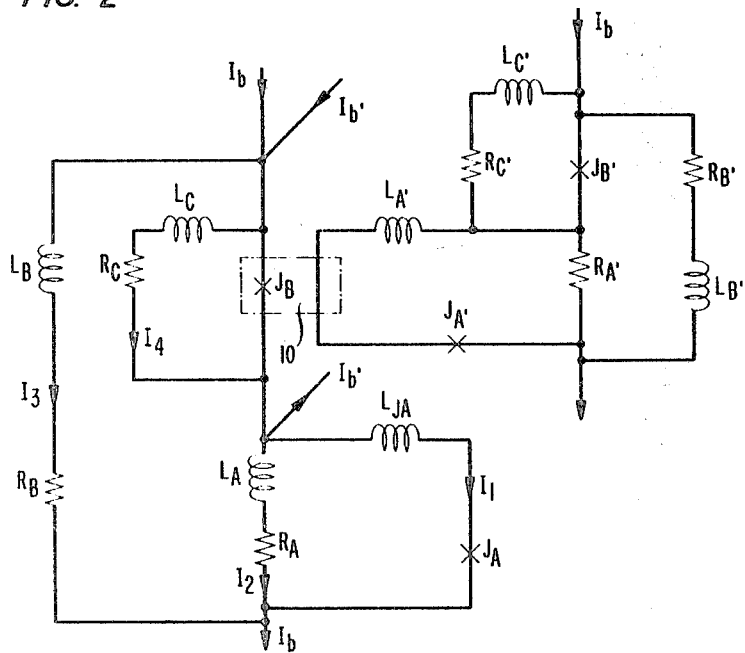
FIG. 2 is a circuit schematic of a preferred embodiment of my invention.

With reference now to FIG. 1, there are shown a pair of self-resetting, relaxation oscillation (SRO) superconductive circuits SRO-1 and SRO-2 coupled to one another by a generalized influence means 10 which allows SRO-2 to control SRO-1 as described hereinafter. Each SRO circuit comprises first and second series connected Josephson junction gates $J_A$ and $J_B$ (or $J_{A'}$ and $J_{B'}$), a first resistive-inductive shunt $R_A$, $L_A$ (or $R_{A'}$, $L_{A'}$) connected in parallel with junction $J_A$ (or $J_{A'}$) and a second resistive-inductive shunt $R_B$, $L_B$ (or $R_{B'}$, $L_{B'}$) connected in parallel with the series combination of $J_A$ and $J_B$ (or $J_{A'}$ and $J_{B'}$). The resistance of the resistors is chosen so that the load line for each gate falls within the unstable region of its I-V characteristic. Therefore, each gate is capable of undergoing relaxation oscillations, but which of the gates is actually oscillating at any particular time depends on how and when control signals are applied. A constant (DC) bias current $I_b$ is applied via conductor means 20 to the series connected gates $J_B$ and $J_A$ (or $J_{B'}$ and $J_{A'}$). For reasons which will become apparent, the B-loop is designated the control (or input) loop and the A-loop is designated the output (or fan-out) loop. As described more fully hereinafter, the output line of the A-loop, however, may be formed either by the branch including $L_A$ and $R_A$ (FIG. 1) or by the branch including $J_A$ and inductance of that branch $L_{JA}$ (FIG. 2).

It is to be understood that the various gates employed in my circuit, especially the control gates $J_B$ or $J_{B'}$, can be single Josephson junctions or a combination of junctions such as an interferometer, or a goalpost circuit of the type described by me in U.S. Pat. No. 4,051,393 issued on Sept. 27, 1977. In the goalpost case, the influence means 10 would include suitable circuit connections adapted to add a fraction of the current in the A'-loop to the bias current in $J_B$ causing it to switch states. For a magnetic field switched device, such as a single junction or an interferometer, a superconductive control line could be made to overlay the single junction or a portion of the interferometer. It is well known that current in the line creates a magnetic field which can be made to depress the critical current below the bias current and cause a Josephson junction to switch states.

From this point on in the description, duplicating references to both unprimed and primed component designations in SRO-1 and SRO-2, respectively, will be discontinued in the interests of simplicity. It will be assumed that references to SRO-1 apply to SRO-2 unless otherwise stated.

Figure 3:
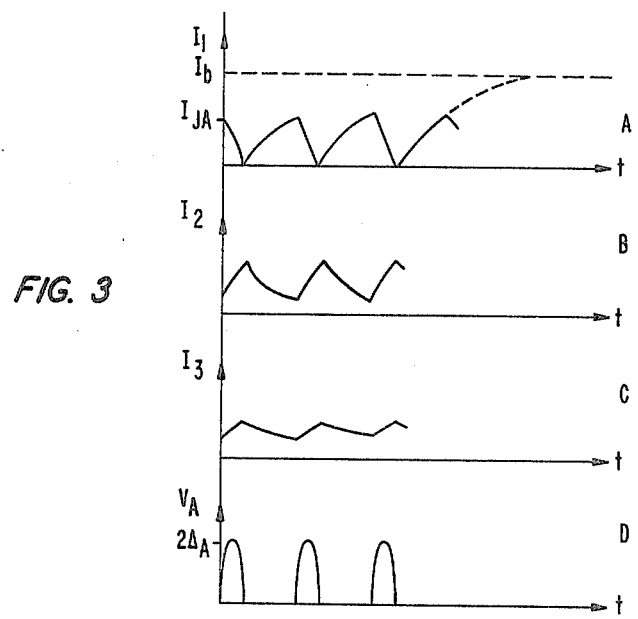
FIGS. 3-4 are graphs of various current and voltage waveforms helpful in understanding the operation of the circuit of FIG. 1.

For proper operation, the $R_B$ resistance and the bias current $I_b$ are chosen so that when the bias current in $J_A$ is larger than its critical current $I_{JA}$, the bias current in $J_B$ will not be larger than $I_{JB}$. Implicitly, therefore, $I_{JA} < I_{JB}$. Thus, in the quiescent state (e.g., logic "1") $J_A$ is oscillating between $V_A=0$ and $V_A \sim 2\Delta_A$ as shown in FIG. 3, Part D and $J_B$ is idling at $V=0$. The current $I_1$ in $J_A$ (FIG. 3, Part A) oscillates, rising to $I_{JA}$ while $V_A=0$ and decreasing to nearly zero while $V_A \neq 0$. This oscillating current is diverted into the A-loop and B-loop as current $I_2$ (FIG. 3 Part B) and $I_3$ (FIG. 3 Part C), respectively, according to the equation $I_b = I_1 + I_2 + I_3$, with the relative proportions being controlled by the series combinations of $L_A$ and $R_A$ and $L_B$ and $R_B$. The rise and decay times of $I_1$, $I_2$ and $I_3$ are also determined by $L_A$, $L_B$, $R_A$ and $R_B$. For example, the decay time of $I_2$ is approximately $L_A/R_A$ if $L_B/R_B >> L_A/R_A$. The waveform for current in $J_B$, which is not shown, would be simply $I_b - I_3$. Note that the AC component of $I_3$ is less than that of $I_2$ because $L_B$ is made greater than $L_A$. Thus, when $J_A$ is switched to $V_A \sim 2\Delta_A$ most of the bias current is switched into the output A-loop where it is available to control other circuits (not shown) in the logic chain.

Figure 4:
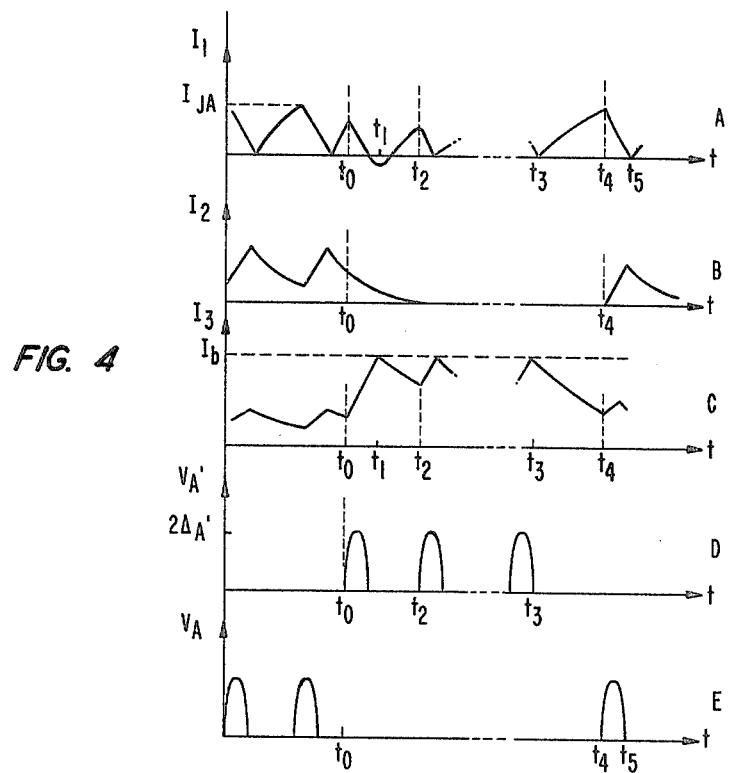

Control of the oscillating state of $J_A$ is derived through $J_B$ which itself is controlled by SRO-2 via influence means 10. Assume, as above, that $J_A$ is oscillating as depicted in FIG. 4, Part E, for $t<t_0$. If at $t=t_0 J_{A'}$ begins oscillating as shown in FIG. 4, Part D, the current pulses on the output line to resistor $R_{A'}$ will cause $J_B$ to switch to $V_B \sim 2\Delta_B$. When that happens, the current that had been flowing into $J_B$ is diverted into the control B-loop becoming $I_3$ as shown in FIG. 4, Part C. $I_3$ rises to $I_b$ in a time $(t_1-t_0)$ thus depriving $J_A$ of its current bias and causing it to stop oscillating. The bias current that is diverted to the shunt through $R_B$ flows back into the branch with $J_B$ and $J_A$ after $t_1$ because $J_B$ self-resets at $t_1$. Note, at $t_1$, when the current in $J_B$ is zero, the current $I_1$ reverses its direction for a short time. If, however, $J_{A'}$ continues to oscillate, and keeps sending pulses down its output line, shortly after $J_B$ resets to the $V=0$ condition, it will receive a pulse $V_{A'}$ (at $t=t_2$, FIG. 4, Part A) which switches it again to its finite voltage state before the bias current can build up far enough to cause $J_A$ to switch again to its finite voltage state. The circuit parameters and biases should be chosen so that the pulses from $J_{A'}$ arrive at the time when $J_B$ can be switched by such pulses but before the time when $J_A$ would switch. At $t=t_3$ when $J_{A'}$ stops oscillating, $I_3$ decreases allowing $I_1$ to reach $I_{JA}$ at $t_4$ when $J_A$ begins oscillating again. It is apparent, therefore, from the foregoing description and a comparison of FIG. 4, Parts D and E, that $J_A$ will be undergoing relaxation oscillations at some typical L/R rate unless $J_{A'}$ is also undergoing relaxation oscillations, in which case $J_A$ will not be receiving enough current to oscillate and there will be no current pulses in its output line (i.e., between $t_0$ and $t_4$, FIG. 4, Part B). In effect, then, the signal seen on the output line from $J_A$ is the negative of the signal seen from $J_{A'}$. The circuit therefore functions as an inverter.

If in addition to SRO-2, there were a third circuit SRO-3 (not shown) including junctions $J_{A''}$ and $J_{B''}$ with $J_{A''}$ possessing control properties over $J_B$ in the same fashion as $J_{A'}$, then the combination of three SROs would function as a two-input NOR gate (i.e., $A = \overline{A' + A''}$ which any of the basic logic operations can be derived. Multiple inputs, three or more, are also possible.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention.

In particular, a comparison of Parts A and B, FIG. 3 indicates that the AC component of $I_2$ is less than that of $I_1$ and suggests a preferred embodiment in which more output current can be attained by making the branch including $J_A$ and $L_{JA}$ the output line as shown in FIG. 2. Higher output currents, of course, mean better switching margins. This configuration is realized simply by designing the circuit topology (e.g., the length and width of the strip lines) to make $L_{JA} >> L_A$. In addition, this configuration enables $L_B$ to be decreased to the approximate size of $L_A$, thus decreasing $L_B/R_B$ and increasing speed. Note that reversing the positions of $J_A$ and $R_A$ does not alter the generic description that $J_A$ and $J_B$ are series connected, that $R_A$-$L_A$ shunts $J_A$ and that $R_B$-$L_B$ shunts $J_A$ and $J_B$.

From a controlled timing standpoint, it is also preferred that $J_B$ be shunted by a resistor $R_C$ and distributed self-inductance $L_C$ so that $L_C/R_C$ is short compared to the period of oscillation of the circuit i.e., of $J_B$. When $J_B$ switches to $V_B \sim 2\Delta_B$, a portion of $I_b$ smaller than $I_{JB}$ flows in the $R_C$-$L_C$ timing loop. When $J_B$ resets to $V_B = 0$, $I_4$ rapidly returns to $J_B$ so that the current level in $J_B$ is sufficiently close to $I_{JB}$ that the next control pulse applied through influence means 10 will cause it to switch.

Further from a controlled timing aspect, one may make use of an auxiliary current bias $I_{b'}$ which may be used to adjust the time at which the current in $J_B$ increases to a level at which a control pulse from influence means 10 will cause $J_B$ to switch relative to the time at which $J_A$ will switch if no such control pulse arrives. Use of $I_{b'}$ implies that $I_{JB}$ need not be larger than $I_{JA}$ and, therefore, $J_A$ and $J_B$ could be substantially identical junctions.

EXAMPLE

A circuit comprising two pairs of SROs each in the configuration of FIG. 1 has been fabricated and tested. The linewidths were 25 μm. Gates $J_A$ and $J_{A'}$ in each pair of SROs comprised a single junction having $I_{JA} = 1.7$ mA and was shunted by $L_A = 100$ pH and $R_A = 0.02\Omega$. Gates $J_B$ and $J_{B'}$ were goalpost configurations having $I_{JB} = 3.4$ mA and were shunted by $R_B = 0.007\Omega$ and $L_B = 100$ pH. The four SROs were so interconnected that the first SRO controlled the second, the second controlled the third, and the third controlled the fourth. Operation in the manner described was achieved. Pulse repetition rates were about 200 MHz.

I claim:

1. A superconductive circuit (SRO-1) comprising
first and second Josephson junction gates ($J_A$ and $J_B$) connected in series with one another, each of said gates having a current voltage characteristic including a zero voltage state and a finite voltage state and an unstable regime in which relaxation oscillations can occur,
a first resistive-inductive shunt ($R_A$, $L_A$) connected in parallel with said first gate so as to form a first output loop, a branch of said first loop forming a first output line ($R_A$, $L_A$ or $J_A$, $L_{JA}$),
a second resistive-inductive shunt ($R_B$, $L_B$) connected in parallel with the series combination of said first and second gates,
conductor means (20) for applying DC current from DC bias means ($I_b$) to said gates,
the resistances of said first and second shunts and the current of said applying means biasing said first and second gates into their unstable regimes where each can undergo relaxation oscillations, so that, in the quiescent state of said circuit, said first gate ($J_A$) is undergoing relaxation oscillations when said second gate ($J_B$) is in its zero voltage state, and
control means (SRO-2) for switching said second gate ($J_B$) to its finite voltage state, thereby causing relaxation oscillations in said first gate ($J_A$) to cease.

2. The circuit of claim 1 wherein said control means includes a second circuit (SRO-2) comprising
third and fourth Josephson junction gates ($J_{A'}$ and $J_{B'}$) connected in series with one another, each of said gates having a current voltage characteristic including a zero voltage state and a finite voltage state and an unstable regime in which relaxation oscillations can occur,
a third resistive-inductive shunt ($R_{A'}$, $L_{A'}$) connected in parallel with said third gate so as to form a second output loop, a branch of said second loop forming a second output line ($R_{A'}$, $L_{A'}$ or $J_{A'}$, $L_{JA'}$)

a fourth resistive-inductive shunt ($R_{B'}$, $L_{B'}$) connected in parallel with the series combination of said third and fourth gates, conductor means for applying DC current from said DC bias means ($I_b$) to said third and fourth gates, said third and fourth shunts and said applying means biasing said third and fourth gates into their unstable regimes where each can undergo relaxation oscillations, so that, in the quiescent of said second circuit, said third gate ($J_{A'}$) is undergoing relaxation oscillations when said fourth gate ($J_{B'}$) is in its zero voltage state, and means (10) for controlling the state of said second gate ($J_B$) in response to current flowing in said second output line so that said first gate ($J_A$) undergoes relaxation oscillations only when said third gate ($J_{A'}$) does not undergo such oscillations.

3. The circuit of claim 1 wherein (FIG. 2) said first output line includes said first gate ($J_A$).

4. The circuit of claim 1 wherein (FIG. 2) said first gate ($J_A$) is included in a circuit branch having a self-inductance ($L_{JA}$) which is much greater than the self-inductance ($L_A$) of said first shunt.

5. The circuit of claim 1 wherein (FIG. 1) said first gate ($J_A$) is included in a circuit branch having a self-inductance ($L_{JA}$) which is much less than the self-inductance ($L_A$) of said first shunt.

6. The circuit of claims 2, 3, 4 or 5 including a resistive-inductive branch ($R_C$, $L_C$) in parallel with said second gate ($J_B$) adapted to that $L_C/R_C$ is short compared to the period of oscillation of said second gate.

* * * * *